(12) United States Patent
Nayfeh et al.

(10) Patent No.: US 8,034,692 B2
(45) Date of Patent: Oct. 11, 2011

(54) STRUCTURE AND METHOD FOR MANUFACTURING ASYMMETRIC DEVICES

(75) Inventors: Hasan M. Nayfeh, Hopewell Junction, NY (US); Andres Bryant, Essex Junction, VT (US); Arvind Kumar, Hopewell Junction, NY (US); Nivo Rovedo, Hopewell Junction, NY (US); Robert R. Robison, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 12/581,924

(22) Filed: Oct. 20, 2009

(65) Prior Publication Data

US 2011/0089499 A1 Apr. 21, 2011

(51) Int. Cl.
*H01L 21/336* (2006.01)
(52) U.S. Cl. ........ 438/302; 438/163; 438/179; 438/217; 438/231; 257/E21.415; 257/E21.621
(58) Field of Classification Search .................. 257/338, 257/408; 438/302, 217, 179, 231, 163
See application file for complete search history.

(56) References Cited

U.S. PATENT DOCUMENTS

| 6,426,262 | B1 | 7/2002 | Fuselier et al. | |
|---|---|---|---|---|
| 6,482,724 | B1* | 11/2002 | Chatterjee | 438/525 |
| 6,593,175 | B2* | 7/2003 | Feudel et al. | 438/152 |
| 6,756,637 | B2 | 6/2004 | Adkisson et al. | |
| 2005/0106799 | A1* | 5/2005 | Doris et al. | 438/199 |
| 2009/0218627 | A1* | 9/2009 | Zhu | 257/368 |
| 2009/0275179 | A1* | 11/2009 | Basker et al. | 438/231 |
| 2011/0073961 | A1* | 3/2011 | Dennard et al. | 257/408 |
| 2011/0079827 | A1* | 4/2011 | Ellis-Monaghan et al. | 257/288 |

* cited by examiner

*Primary Examiner* — Ahmed Sefer
(74) *Attorney, Agent, or Firm* — Joseph Petrokaitis

(57) ABSTRACT

A plurality of gate structures are formed on a substrate. Each of the gate structures includes a first gate electrode and source and drain regions. The first gate electrode is removed from each of the gate structures. A first photoresist is applied to block gate structures having source regions in a source-down direction. A first halo implantation is performed in gate structures having source regions in a source-up direction at a first angle. The first photoresist is removed. A second photoresist is applied to block gate structures having source regions in a source-up direction. A second halo implantation is performed in gate structures having source regions in a source-down direction at a second angle. The second photoresist is removed. Replacement gate electrodes are formed in each of the gate structures.

7 Claims, 12 Drawing Sheets

STRUCTURE AND METHOD FOR MANUFACTURING ASYMMETRIC DEVICES

BACKGROUND OF THE INVENTION

The present invention relates generally to the manufacture of semiconductor integrated circuits (IC's), and particularly to the formation of field effect transistors (FETs) and, more particularly, to the formation of asymmetric halo implants in sub-45 nm technology FETs.

The current process for the formation of asymmetric devices in sub-45 nm technology ground rules is limited by shadowing and adjacency effects. Each asymmetric halo implant is shadowed by a block photoresist. An edge of the photoresist blocks the halo implant. Shadowing lowers the halo pocket doping concentration. This results in low threshold voltage and leaky transistor devices. Also, the electrical properties of asymmetric devices are perturbed due to the implantation steps necessary to enable adjacent devices. Each halo implant penetrates into the adjacent device.

SUMMARY OF THE INVENTION

In a first aspect of the invention, a method of forming a device includes providing a substrate. The method includes forming a plurality of gate structures on the substrate, wherein each of the gate structures includes a first gate electrode and source and drain regions. The method includes removing the first gate electrode from each of the gate structures. The method includes applying a first photoresist to block gate structures having source regions in a source-down direction. The method includes performing a first halo implantation in gate structures having source regions in a source-up direction at a first angle. The method includes removing the first photoresist. The method includes applying a second photoresist to block gate structures having source regions in a source-up direction. The method includes performing a second halo implantation in gate structures having source regions in a source-down direction at a second angle. The method further includes removing the second photoresist. The method also includes forming a replacement gate electrode in each of the gate structures.

In a further aspect of the invention, a method of forming a device includes forming a plurality of gate electrode structures on a substrate, the gate electrode structures having first sides. The method includes forming offset spacers on the sides of the gate electrode structures, the offset spacers having second sides. The method includes forming deep source/drain spacers on the second sides of the offset spacers. The method includes forming source and drain regions adjacent to the gate electrode structures. The method includes depositing a first dielectric layer over the gate electrode structures. The method includes polishing the first dielectric layer to be co-planar with a top of the gate electrode structures. The method includes removing gate electrodes from the gate electrode structures. The method includes applying a first photoresist to block gate electrode structures having source regions in a source-down direction. The method includes performing a first halo implantation in gate structures having source regions in a source-up direction at a first angle. The method includes removing the first photoresist. The method includes applying a second photoresist to block gate structures having source regions in a source-up direction. The method includes performing a second halo implantation in gate structures having source regions in a source-down direction at a second angle. The method includes removing the second photoresist. The method includes performing an activation anneal. The method includes depositing a second dielectric layer over the gate electrode structures. The method includes forming replacement gate electrodes in each of the gate electrode structures. The method further includes removing the second dielectric layer. The method also includes performing salicide processing.

In a yet further aspect of the invention, a device includes a substrate. The device includes a plurality of gate structures formed on the substrate, wherein gate electrodes have been removed from the gate structures and the gate structures have source regions in a source-up direction and a source-down direction. The device further includes photoresist applied to block gate structures having source regions in a source-down direction. The device also includes a plurality of halo implants formed in the gate structures having source regions in a source-up direction.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

Figure 10:
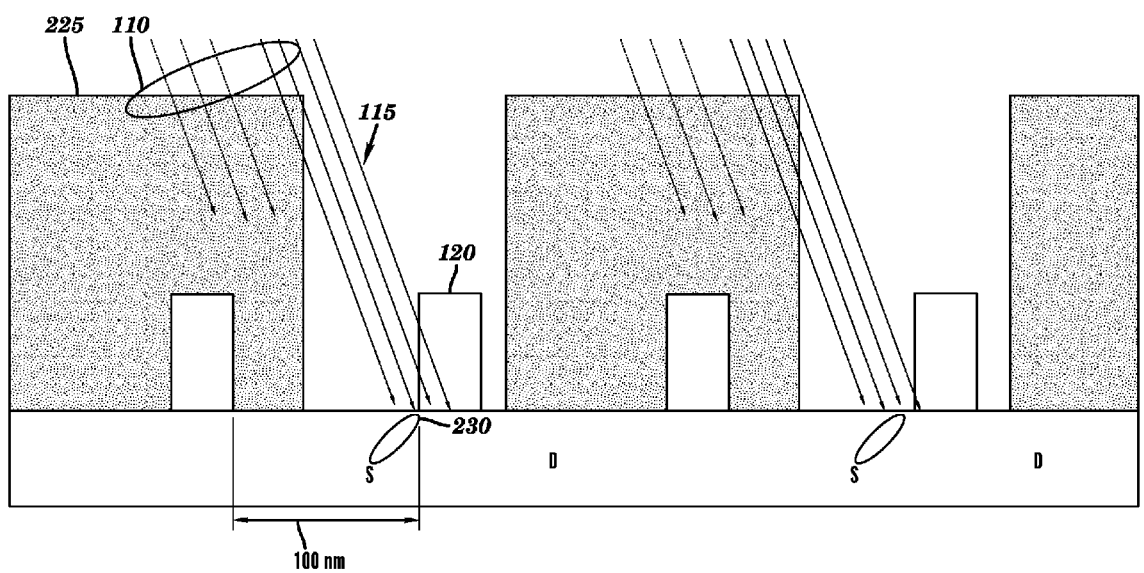
FIG. 10 shows a block photoresist shadowing a halo implant.

Referring to FIG. 10, it has been observed that the onset of shadowing 110 for a 32 nm asymmetric scheme occurs when the distance from an edge of a block photoresist 220 to an edge of a gate 120 one is trying to implant is less than 110 nm for nominal angle halo implant 115 conditions of 20 degrees using 180 nm thick photoresist. Ground rules dictate that the gate to gate spacing is approximately 100 nm. As a result, shadowing always occurs. Shadowing lowers the halo implant 230 doping concentration.

Figure 11:
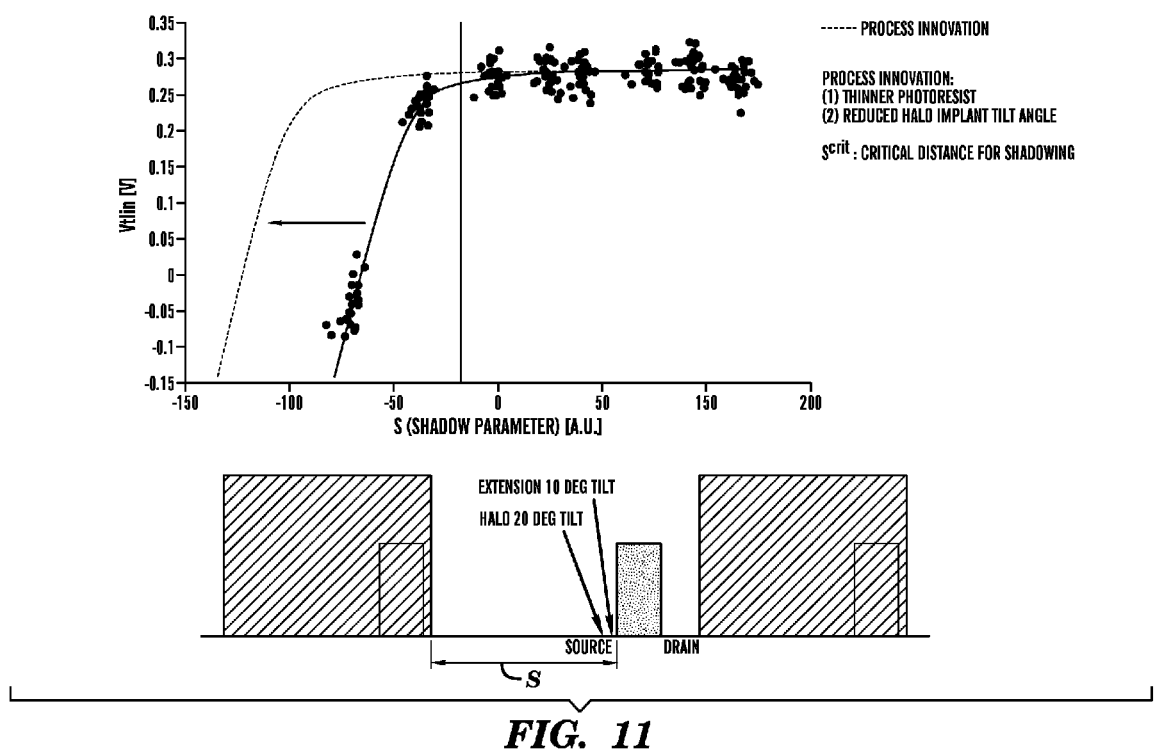
FIG. 11 shows an asymmetric device at the point of asymmetric halo and tilted extension implant with neighboring devices covered by photolithography and the impact of the photolithograpy block mask level edge distance to the gate electrode (S) on the linear threshold voltage ($V_{tlin}$)
Figure 12:
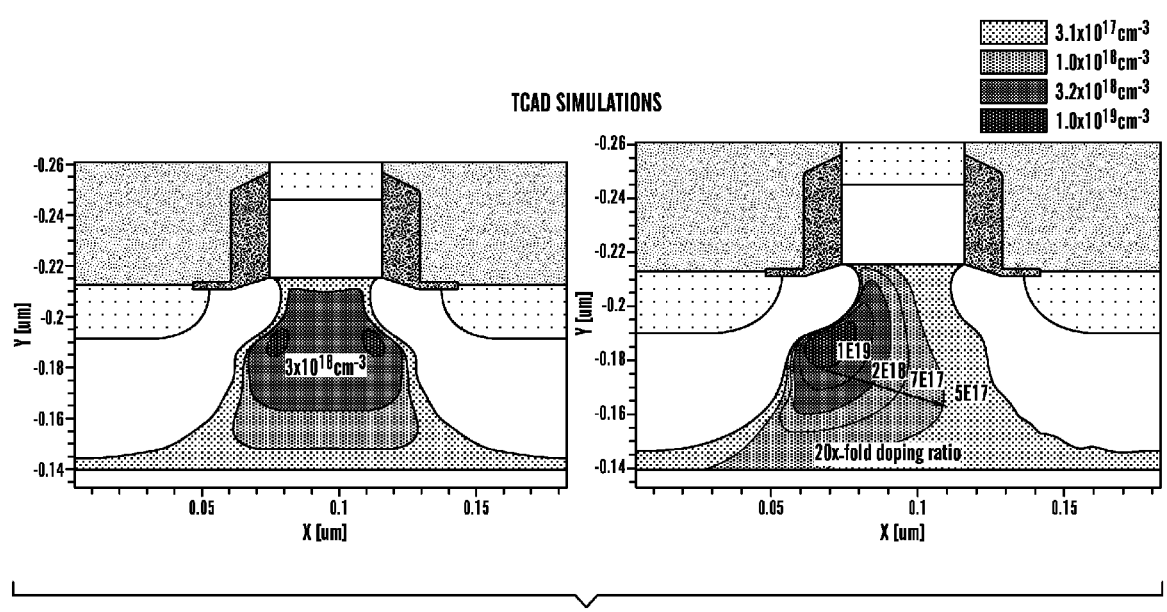
FIG. 12 shows a TCAD computer simulation of the doping profile for asymmetric and symmetric control devices.

Referring to FIG. 11, the metric employed to quantify shadowing, S, is defined as the distance from the mask edge to the gate electrode. Systematic mask edge placement experiments that vary the S parameter from twice the minimum gate contact pitch down to sub-pitch values were executed and reveal through measurement of the linear threshold voltage, $V_{tlin}$, that the onset of shadowing occurs at $S=S_{crit}$. For $S<S_{crit}$ the $V_{tlin}$ vs S behavior shows a steep decline with decreasing S. The onset of shadowing is reduced for lower halo tilt angle and thinner photoresist enabling future implementation for technologies scaled beyond 45 nm. The other consideration taken is mitigation of penetration of the asymmetric halo implant into the drain of such devices. Such penetration increases the doping level at the drain-side of such devices reducing the lateral gradient from source-drain and hence attenuating the asymmetric benefits. The reduction of $V_{tlin}$ for S values less than $S_{crit}$ is attributed to shadowing of the asymmetric halo implant by the photoresist blocking layer. Reducing the photoresist thickness and decreasing the tilt angle of the implant both result in larger process window through reduction of $S_{crit}$.

Figure 1:
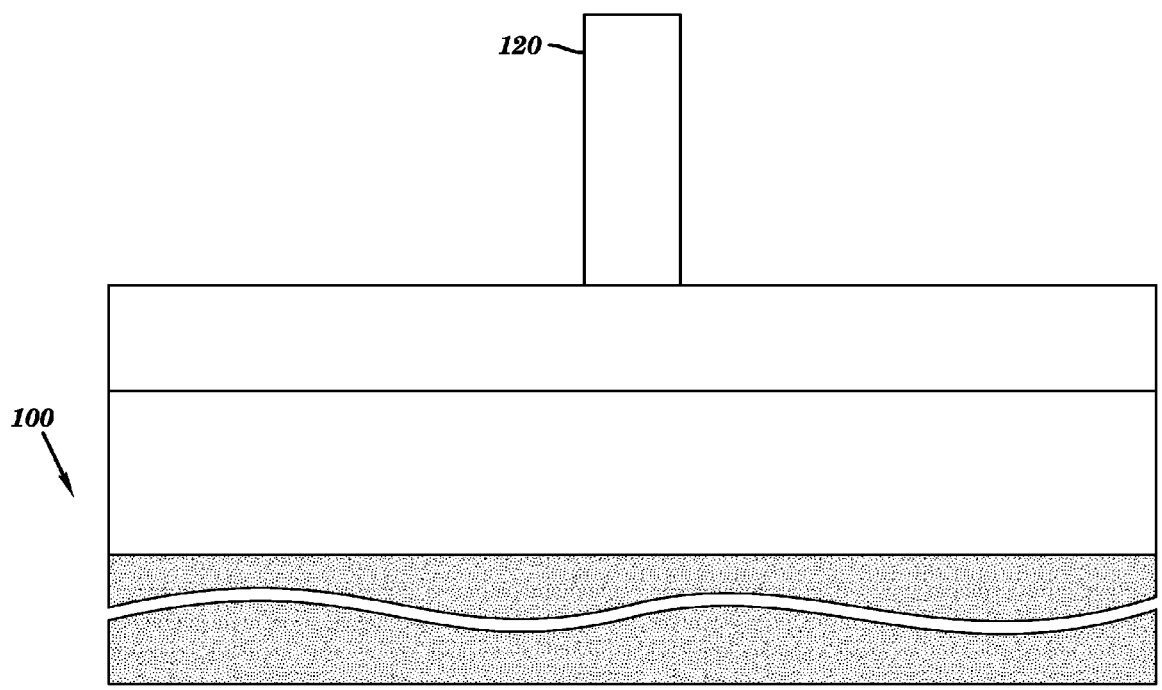
FIG. 1 shows a starting structure and processing steps in accordance with an embodiment of the invention.

FIG. 1 shows a starting structure and processing steps in accordance with an embodiment of the invention. Asymmetric NFET devices may be defined using photolithography masking allowing for the fabrication of symmetric PFET devices and asymmetric NFET devices on the same chip. Each gate structure of a plurality of gate structures includes a gate electrode 120 formed on a substrate 100 using conventional manufacturing processes known in the art. Substrate 100 may be bulk silicon, silicon on insulator (SOI) or other substrate known in the art. Gate electrode 120 may be polysilicon, oxynitride, high-k metal or other material known in the art. The gate length is consistent with sub-45 nm technologies. The gate length may typically be less than 40 nm.

Figure 2:
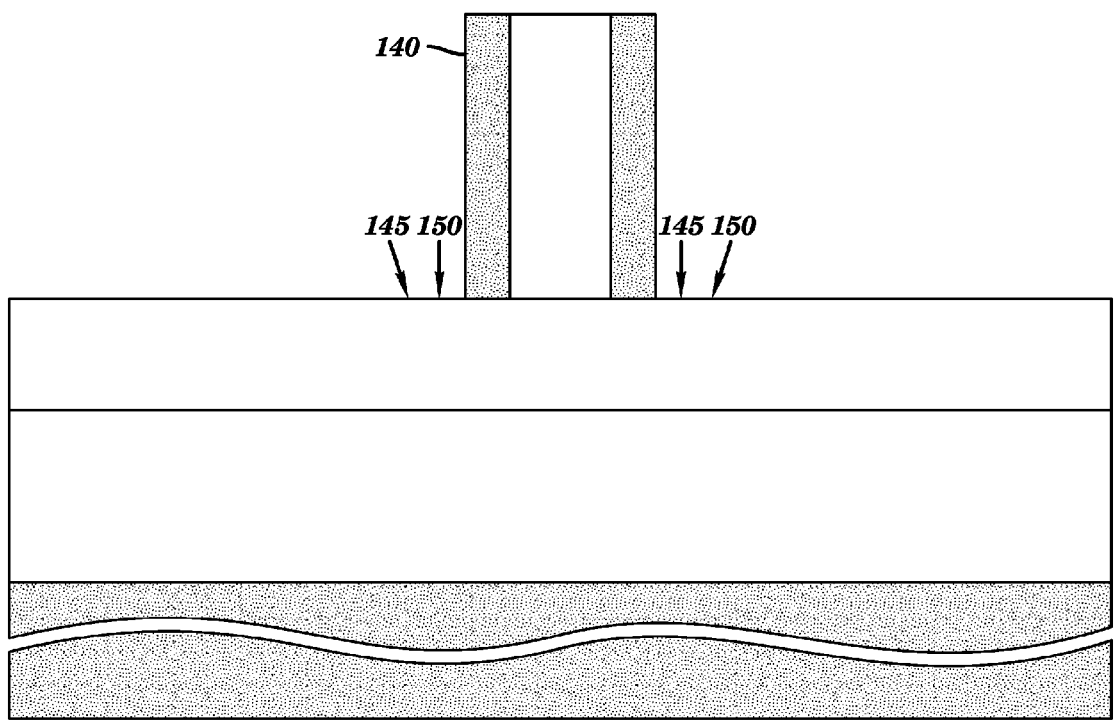
FIGS. 2-8 show processing steps and intermediate structures in accordance with an embodiment of the invention.

Referring to FIG. 2, offset spacers 140 may be formed using conventional processes known in the art. Unified extension 145 and pre-amorphization implantation (PAI) 150 may be performed using conventional processes known in the art. For example, arsenic may be implanted at an energy of 2 KeV, a dosage of 2.1E15 cm-2 and at an angle of 7 degrees. Xenon may be implanted at an energy of 40 KeV, a dosage of 5.0E15 cm-2 and at an angle of 0 degrees.

Figure 3:
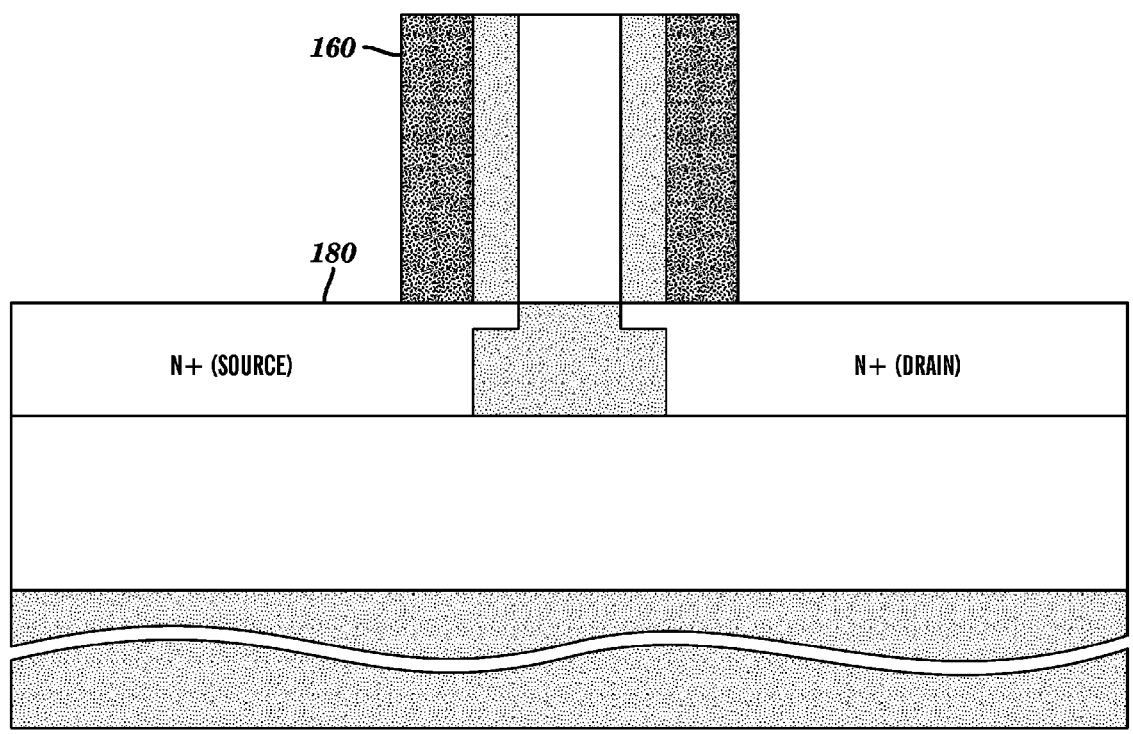

Referring to FIG. 3, deep source/drain spacers 160 may be formed using conventional processes known in the art. Deep source/drain implantation may be performed to form source/drain regions 180 using conventional processes known in the art.

Figure 4:
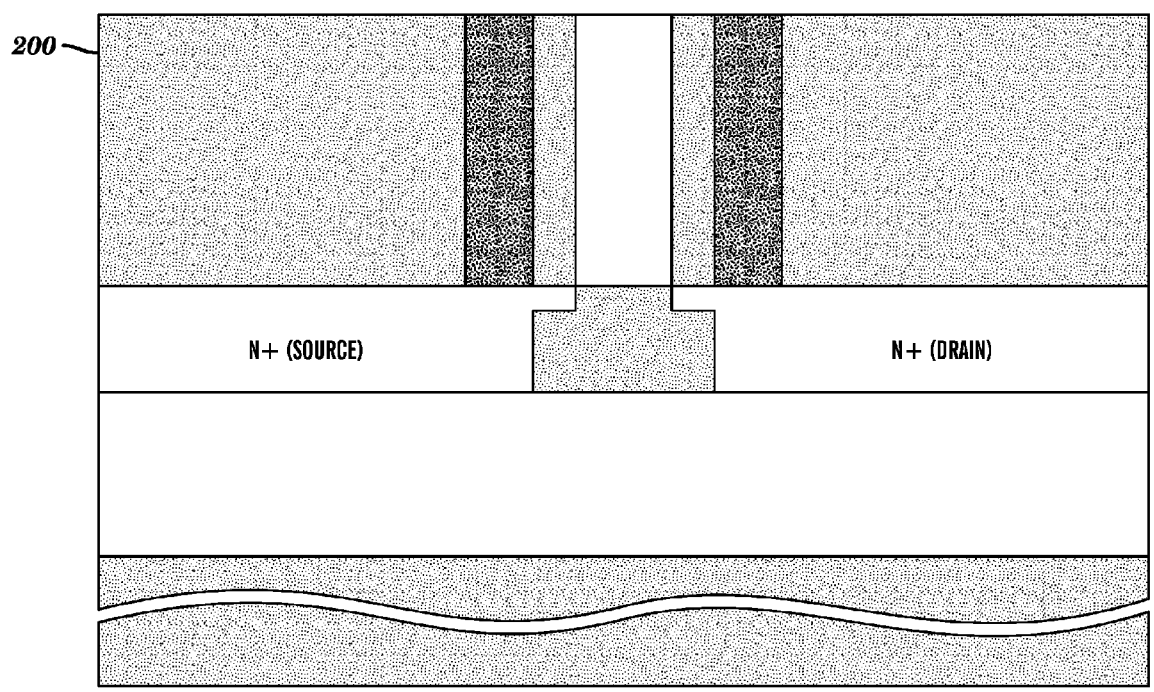

Referring to FIG. 4, a dielectric layer 200 may be deposited on top of gate electrode 120, spacers 140, 160 and substrate 100. Dielectric layer 200 may be deposited by thermal oxidation or any known or later developed processes. Dielectric layer 200 may include, but is not limited to: zirconium oxide (ZrO2), hafnium oxide (HfO2), zirconium silicate (ZrSiO4) and hafnium silicate (HfSiO4). Dielectric layer 200 may be polished to be co-planar with a top of gate electrode 120. Chemical mechanical polishing (CMP) may be performed. Silicide processing has not yet been performed.

Figure 5:
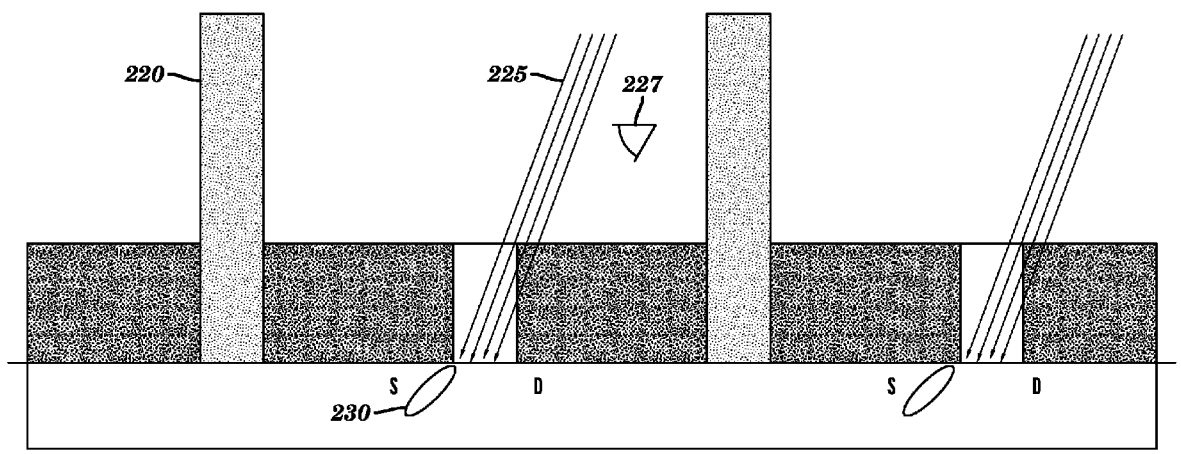

Referring to FIG. 5, four gate structures of a plurality of gate electrode structures are shown having source ("S") and drain ("D") regions. Source-up and source-down configurations may be delineated using photolithography masking. Two of the gate structures may have source regions in a source-up direction. The other two gate structures may have source regions in a source-down direction. Gate electrode 120 has been removed from each of the gate structures using conventional processes known in the art. A photoresist 220 may be applied to block gate structures having source regions in a source-down direction that will not be implanted. The thickness of photoresist 220 is consistent with the gate length and may be very narrow, down to sub-25 nm gate lengths. The height of photoresist 220 may vary as desired. The height may vary from approximately 25 nm to 700 nm. Gate structures having source regions in a source-up direction may be asymmetrically halo implanted 225 to form halo implants 230. The halo angle 227 may be approximately 10 degrees to 20 degrees. Asymmetric lateral channel doping may be formed. The lateral dimension of photoresist 220 may be equal to the gate length. Photoresist 220 is very thin and does not contribute to any shadowing. The halo pocket doping concentration is at expected levels due to the almost complete elimination of shadowing.

In combination with the asymmetric halo implantation, a titled extension at an angle of approximately 10 degrees may be executed (not shown) in order to achieve sufficient junction overlap at the highly doped source-side of the gate structures. The drain overlap is achieved through a zero degree tilt extension implant.

Figure 6:
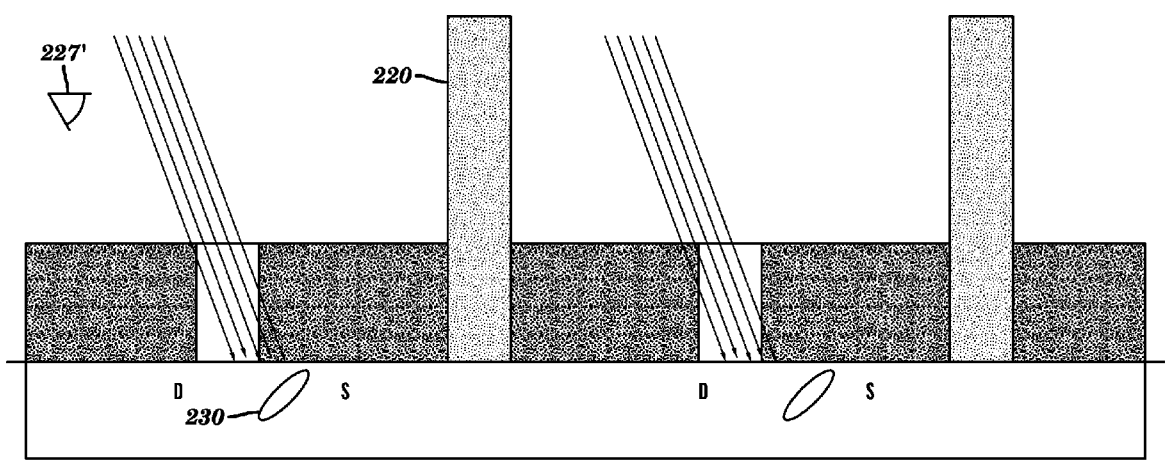

Referring to FIG. 6, photoresist 220 may be removed using conventional processes as known in the art. Photoresist 220 may be ashed away. Gate structures having source regions in the other source direction may be blocked with photoresist 220. Gate structures having source regions in a source-down direction may be asymmetrically halo implanted 225 to form asymmetric halo implants 230. The halo angle 227' may be approximately 10 degrees to 20 degrees. Preferably halo angle 227' may be 15 degrees. After photoresist 220 is removed, asymmetric halo implant 230 may be activation annealed using rapid thermal anneal (RTA) and laser spike anneal (LSA). Alternatively, only LSA may be used. The halo pocket doping concentration is at expected levels due to the almost complete elimination of shadowing.

Figure 7:
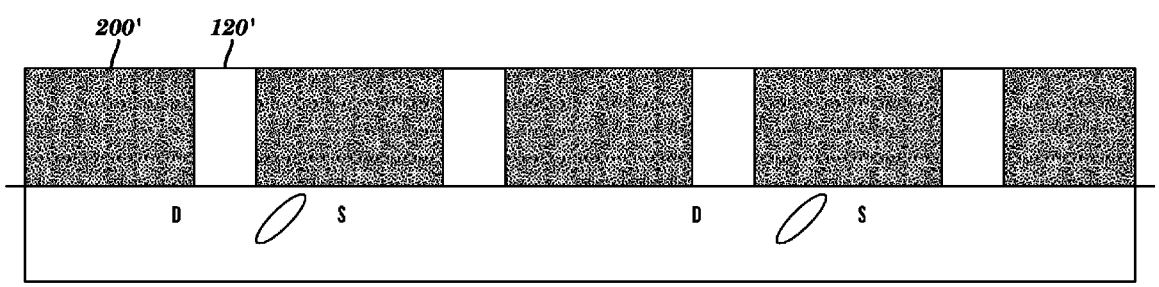

Referring to FIG. 7, gate replacement processing occurs. Gate electrodes 120' may be formed once again using conventional processes as known in the art. Dielectric layer 200' may be deposited again using conventional processes as known in the art. Gate electrodes 120' may be polysilicon, oxynitride, high-k metal or other material known in the art. Dielectric layer 200' may include, but is not limited to: zirconium oxide (ZrO2), hafnium oxide (HfO2), zirconium silicate (ZrSiO4) and hafnium silicate (HfSiO4).

Figure 8:
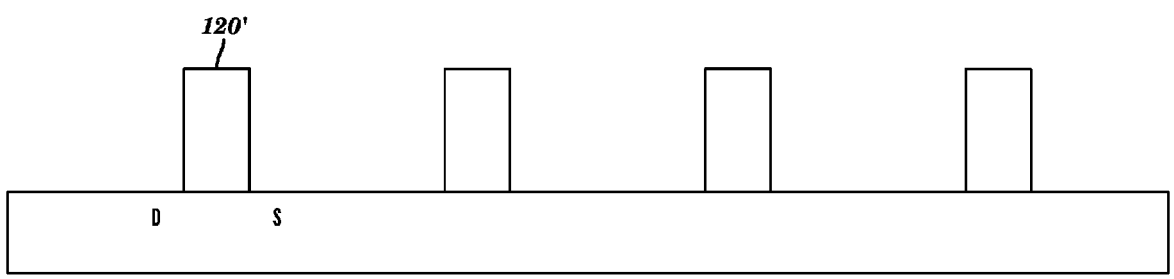

Referring to FIG. 8, dielectric layer 200' may be etched away using conventional processes as known in the art. Reactive ion etching (RIE) may be combined with wet etching.

Figure 9:
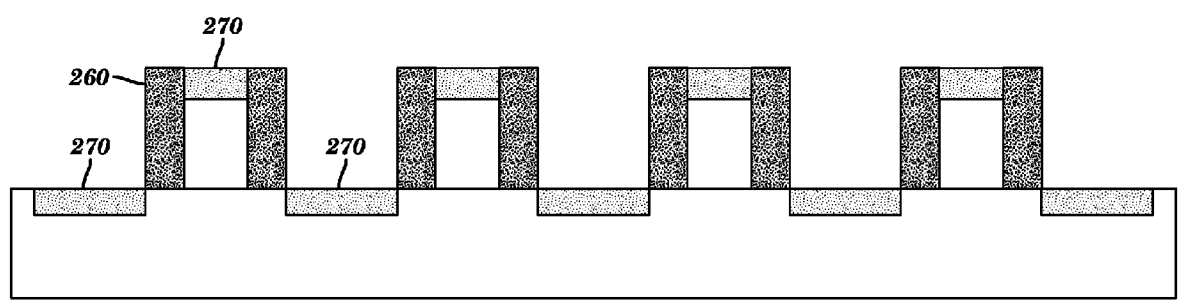
FIG. 9 shows processing steps and a final structure in accordance with an embodiment of the invention.

Referring to FIG. 9, spacers 260 may be formed using conventional processes as known in art. Salicidation processing may be performed for contacting the gate electrode and source/drain areas. Salicides 270 are formed on the gate electrode, source and drain. After this step, conventional CMOS processes may be used to finish the devices, including, but not limited to contact via formation and copper metallization.

Referring to FIG. 11, TCAD numerical simulations show the active doping concentration for asymmetric and the symmetric control devices which show a large lateral gradient doping profile for the asymmetric devices with a source-side halo pocket of $1 \times 10^{19}$ cm$^{-3}$ concentration and a low doped drain channel doping of $5 \times 10^{17}$ cm$^{-3}$ a change of 20x-fold. The doping profile of the symmetric device is close to uniform with a channel doping concentration of $3 \times 10^{18}$ cm$^{-3}$.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising:
    providing a substrate;
    forming a plurality of gate structures on the substrate, wherein each of the gate structures includes a first gate electrode and source and drain regions;
    removing the first gate electrode from each of the gate structures;
    applying a first photoresist to block gate structures having source regions in a source-down direction;
    performing a first halo implantation in gate structures having source regions in a source-up direction at a first angle;
    removing the first photoresist;
    applying a second photoresist to block gate structures having source regions in a source-up direction;
    performing a second halo implantation in gate structures having source regions in a source-down direction at a second angle;
    removing the second photoresist; and
    forming a replacement gate electrode in each of the gate structures.

2. A method according to claim 1, wherein the substrate comprises bulk silicon.

3. A method according to claim 1, wherein the substrate comprises silicon on insulator (SOI).

4. A method according to claim 1, wherein the first gate electrode is selected from the group consisting of: polysilicon, oxynitride and high-k metal.

5. A method according to claim 1, wherein the second gate electrode is selected from the group consisting of: polysilicon, oxynitride and high-k metal.

6. A method according to claim 1, wherein the first angle is between 10 and 20 degrees.

7. A method according to claim 1, wherein the second angle is the same as the first angle.

* * * * *